(12) United States Patent
Chen et al.

(10) Patent No.: US 8,198,620 B2
(45) Date of Patent: Jun. 12, 2012

(54) RESISTANCE SWITCHING MEMORY

(75) Inventors: Frederick T. Chen, Hsinchu County (TW); Ming-Jinn Tsai, Hsinchu (TW); Wei-Su Chen, Hsinchu (TW); Heng-Yuan Lee, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 287 days.

(21) Appl. No.: 12/636,794

(22) Filed: Dec. 14, 2009

(65) Prior Publication Data
US 2011/0140067 A1   Jun. 16, 2011

(51) Int. Cl.
H01L 47/00 (2006.01)
H01L 29/02 (2006.01)
H01L 29/06 (2006.01)

(52) U.S. Cl. ..... 257/4; 257/2; 257/5; 257/13; 257/E45.002; 257/E33.046; 257/E21.004; 257/E21.645; 438/102; 438/103

(58) Field of Classification Search .................. 257/2, 4, 257/5, 13, E45.002, E33.046, E21.004, E21.645; 438/102, 103
See application file for complete search history.

(56) References Cited

U.S. PATENT DOCUMENTS

| | | | |
|---|---|---|---|
| 5,744,387 A | 4/1998 | Tseng | |
| 2001/0000242 A1 | 4/2001 | Huang | |
| 2005/0276099 A1* | 12/2005 | Horng et al. | 365/158 |
| 2006/0017115 A1 | 1/2006 | Tu et al. | |
| 2008/0121864 A1 | 5/2008 | Seo et al. | |
| 2008/0170427 A1 | 7/2008 | Choi et al. | |
| 2011/0031562 A1* | 2/2011 | Lin et al. | 257/410 |

OTHER PUBLICATIONS

W.S. Chen et al., "A Novel Cross-Spacer Phase Change Memory with Ultra-Small Lithography Independent Contact Area," 2007 IEEE, pp. 319-322.
H.Y. Lee et al., "Low Power and High Speed Bipolar Switching with a Thin Reactive Ti Buffer Layer in Robust HfO2 Based RRAM," IEDM 2008.
H. Kim et al., "Engineering chemically abrupt high-k metal oxide/silicon interfaces using an oxygen-gettering metal overlayer," Journal of Applied Physics. vol. 96, No. 6, Sep. 15, 2004, p. 3467-3472.
Lin et al., "Effect of top electrode material on resistive switching properties of ZrO2 film memory devices," IEEE Electron Device Letters, vol. 28, No. 5, May 2007, p. 366-368.

* cited by examiner

*Primary Examiner* — Long Tran
(74) *Attorney, Agent, or Firm* — Jianq Chyun IP Office

(57) ABSTRACT

A resistance switching memory is introduced herein. The resistance switching memory includes a highly-insulating or resistance-switching material formed to cover the sidewall of a patterned metal line, and extended alongside a dielectric layer sidewall to further contact a portion of the top surface of the lower electrode. The other part of the top surface of the lower electrode is covered by an insulating layer between the top electrode and the lower electrode. An oxygen gettering metal layer in the lower electrode occupies a substantial central part of the top surface of the lower electrode and is partially covered by the highly-insulating or resistance-switching material. A switching area is naturally very well confined to the substantial central part of the oxygen gettering metal layer of the lower electrode.

19 Claims, 13 Drawing Sheets

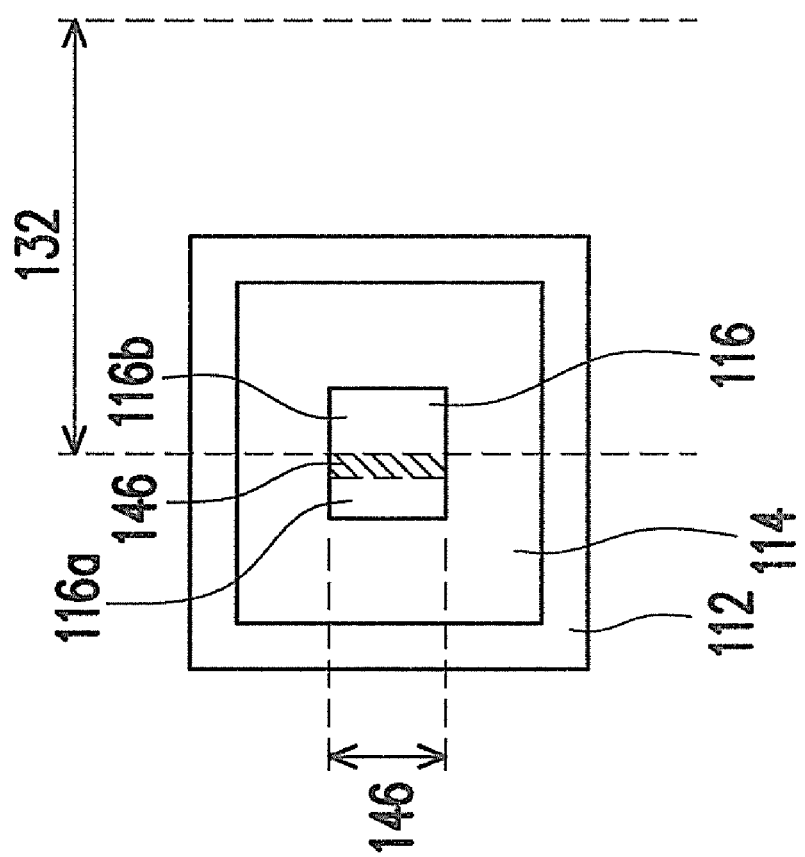

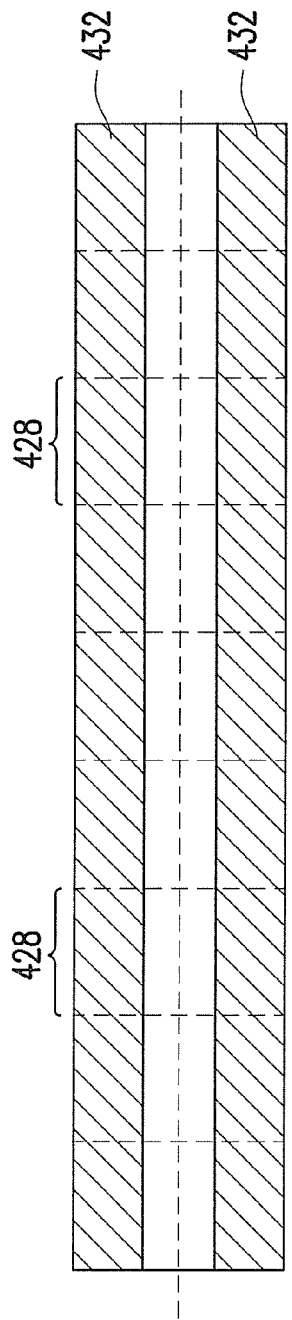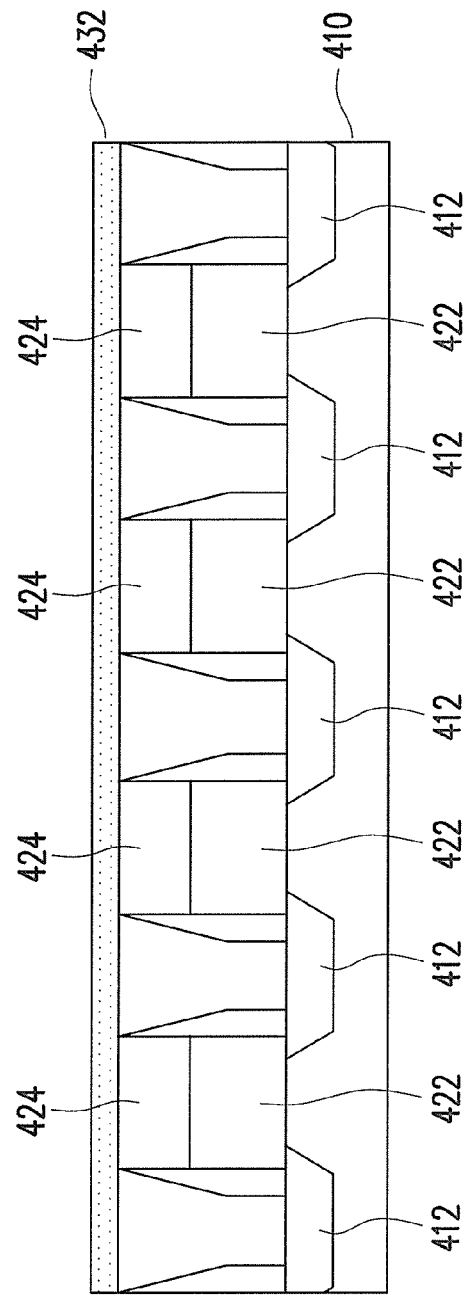
FIG. 5A
FIG. 5B

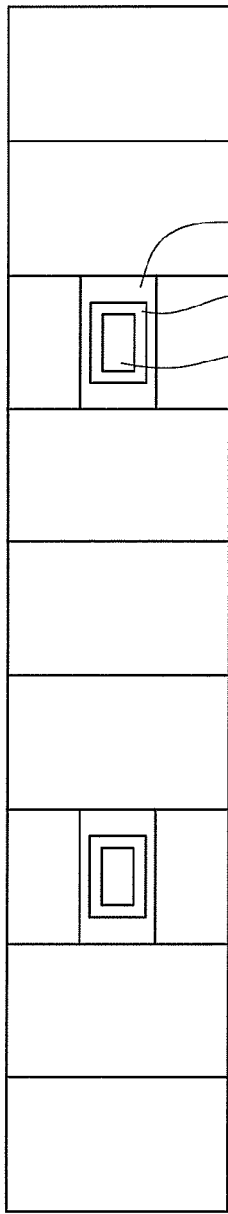
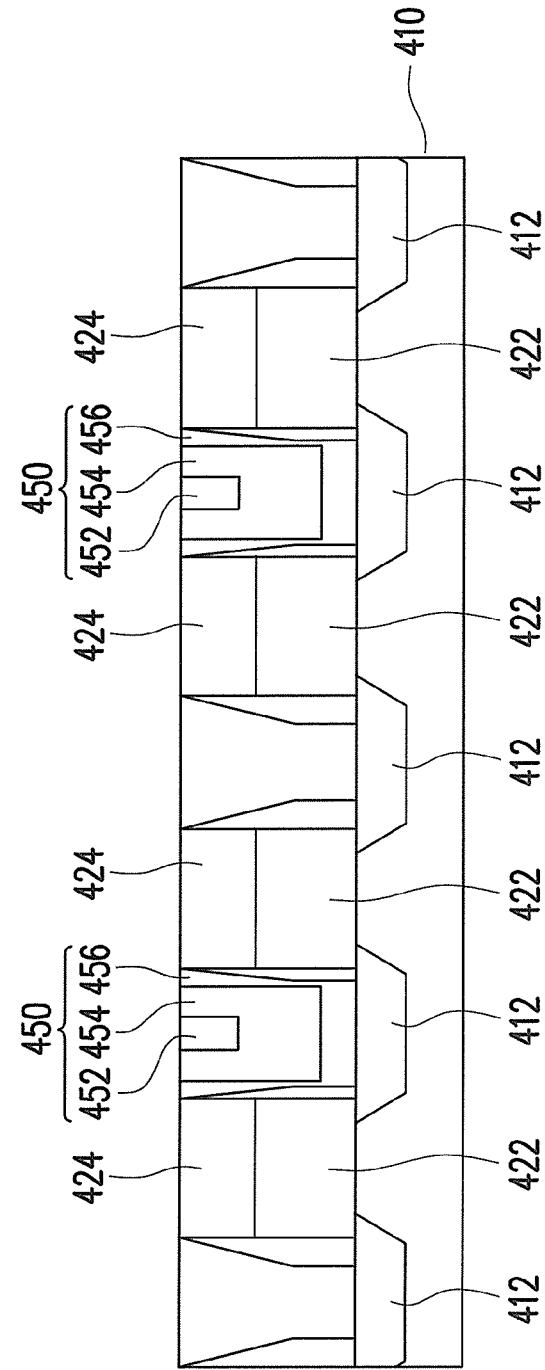
FIG. 7A
FIG. 7B

RESISTANCE SWITCHING MEMORY

BACKGROUND

1. Technical Field

The present invention relates to a resistance switching memory.

2. Description of Related Art

It is highly desirable to develop a high-speed, low-power random access memory technology that is able to retain data under significant stress (e.g. 100° C. 10 years) and also simple to fabricate. Resistive random access memory (RRAM) currently is the strongest candidate to satisfy these criteria. While the technology is relatively forgiving in terms of structural requirements, certain processes in the fabrication sequence, e.g., etching, are more likely to damage the oxide, making its performance less attractive. Also, to enable scaling to smaller sizes, layouts are often preferred to be "lithography-friendly," often suggesting the need to accommodate line-shaped structures and self-aligned contacts. Finally, the switching area is preferred to be confined to a sublithographic area.

In the related arts, Tseng patent (Vanguard, U.S. Pat. No. 5,744,387) disclosed a method of DRAM fabrication, where the bit line was patterned first and insulated by sidewall spacers before forming the capacitor. Huang patent (TSMC, U.S. Pat. Pub. No. 20010000242) disclosed a similar method of DRAM fabrication, except sidewall spacers were not formed, but the bit lines were still insulated and openings are etched through the insulating layer for the capacitor node contacts. Tu et al. (TSMC, U.S. Pat. Pub. No. 20060017115) disclosed fabricating an MIM capacitor with same process as for a metal gate electrode. The MIM capacitor has a top electrode overlying the capacitor dielectric.

Seo et al. (Samsung, U.S. Pat. Pub. No. 20080121864) disclosed a resistive random access memory and method of manufacturing the same. A stacked structure with two electrodes and a resistive layer including transition metal dopants interposed therein is disclosed. Choi et al. (Samsung, U.S. Pat. Pub. No. 20080170427) disclosed resistive random access memory devices including sidewall resistive layers and related methods. Both disclosed inventions suffer from potential processing damage during the etching of the resistance layer stack.

SUMMARY

A resistance switching memory is provided. The resistance switching memory comprises a stacked structure comprising a lower electrode, an insulating layer and a top electrode stacked sequentially. The top electrode is line-shaped. The resistance-switching material layer covers the sidewall of the line-shaped top electrode, and extended alongside to further contact a portion of a surface of a lower electrode.

In one exemplary embodiment, the lower electrode comprises an oxygen gettering metal layer disposed therein, and the resistance-switching material layer covering the surface of the lower electrode contact an part of the oxygen gettering metal layer.

In one exemplary embodiment, the oxygen gettering metal layer is made of Ti and the resistance-switching material layer is made of $HfO_2$, and a switching area is confined to an area between the lower electrode and the resistance-switching material layer.

In one exemplary embodiment, a switching area is confined to an area beneath a part of the resistance-switching material layer extended alongside the sidewall of the top electrode and the insulating layer, and over the contact surface between the lower electrode and the resistance-switching material layer.

In order to make the aforementioned and other features of the present invention more comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate exemplary embodiments and, together with the description, serve to explain the principles of the invention.

FIG. 1C is a top view of the bottom electrode structure of the resistance switching memory according to the exemplary embodiment.

FIGS. 4A~9A illustrate a top view a method for fabricating a RRAM structure, and FIGS. 4B~9B illustrate a cross-section view of the method in one exemplary embodiment.

DESCRIPTION OF DISCLOSED EMBODIMENTS

To develop a high-speed, low-power random access memory technology that is able to retain data under significant criteria, such as 100° C. over 10 years, and/or simple to fabricate, a resistance switching memory such as, for example, a resistive random access memory (RRAM) or a phase change memory (PCM), is proposed herein.

In the proposed resistance switching memory, in order to avoid the damages in fabrication, a resistance switching material, for example, an oxide such as $HfO_2$, is deposited after the top electrode is patterned. In a lithographic-friendly layout, the top electrode will be a line. Furthermore, the oxide directly contacts a lower bottom electrode, which is preferably formed as a self-aligned contact, also to serve the lithographic-friendly layout. The bit line is separated vertically from the lower electrode by a metal pedestal.

The proposed resistance switching memory includes a highly-insulating or resistance-switching material formed to cover the sidewall of a patterned metal line, and extended alongside a dielectric layer sidewall to further contact a portion of the top surface of the lower electrode. The other part of the top surface of the lower electrode is covered by an insulating layer between the top electrode and the lower electrode. An oxygen gettering metal layer in the lower electrode occupies a substantial central part of the top surface of the lower electrode and is partially covered by the highly-insulating or resistance-switching material. A switching area is naturally very well confined to the substantial central part of the oxygen gettering metal layer of the lower electrode.

Figure 1A:
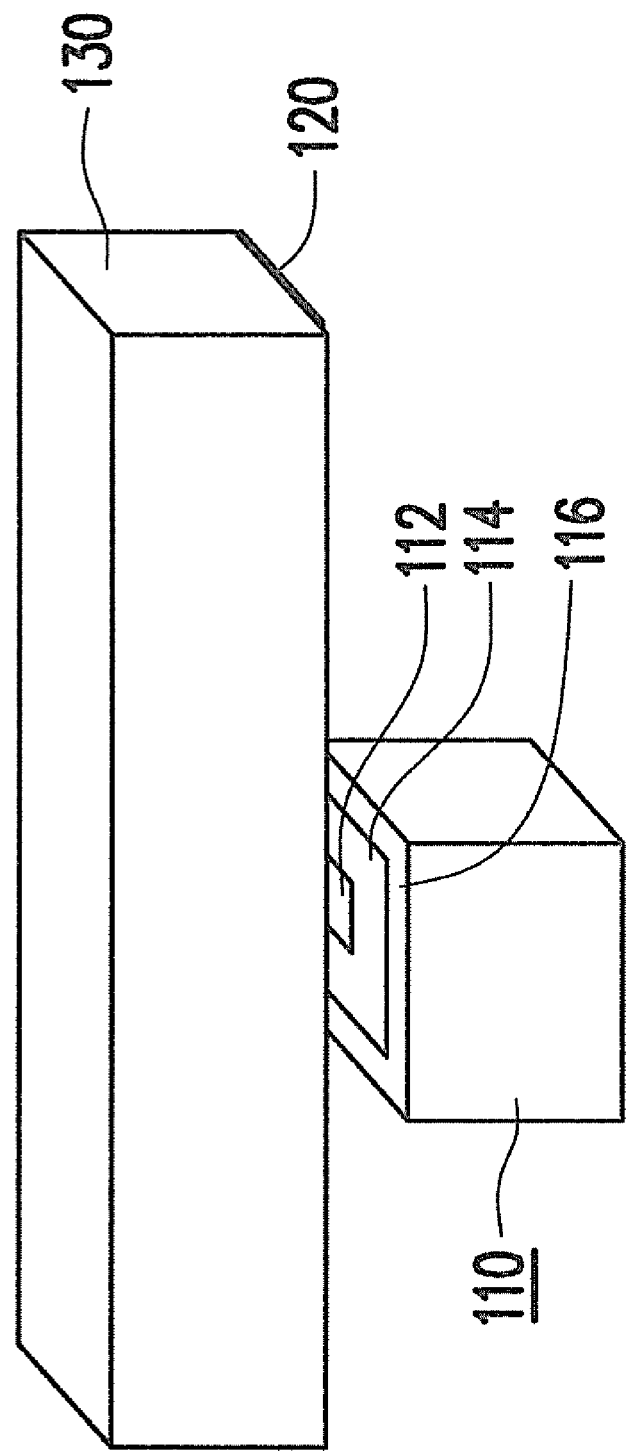
FIG. 1A is a schematically lateral view of a part of the resistance switching memory according to the exemplary embodiment.
Figure 1B:
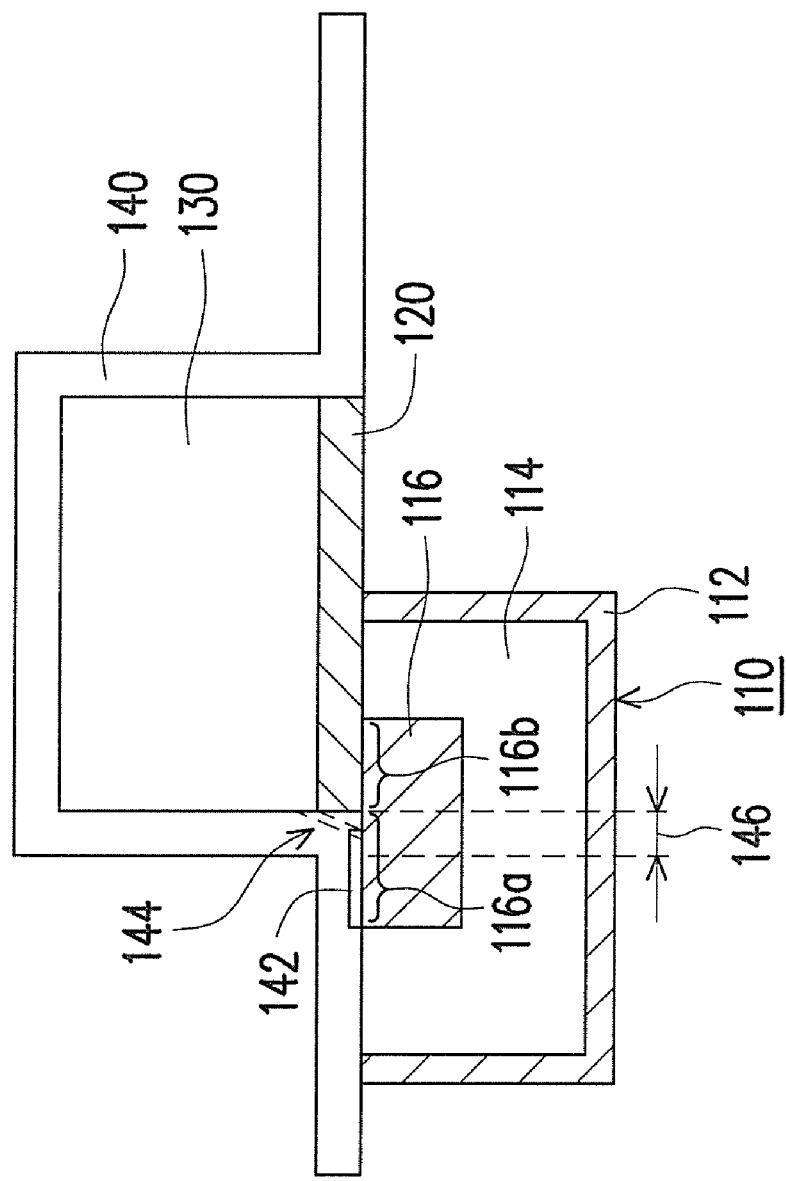
FIG. 1B is a schematically cross-sectional view of the resistance switching memory according to the exemplary embodiment.

FIG. 1A~FIG. 1C are schematic drawings in different views for a resistance switching memory according to one of exemplary embodiments. FIG. 1A is a schematically lateral view of a part of the resistance switching memory according to the exemplary embodiment. FIG. 1B is a schematically cross-sectional view of the resistance switching memory according to the exemplary embodiment. FIG. 1C is a top view of the bottom electrode structure of the resistance switching memory according to the exemplary embodiment.

Referring to FIG. 1A, the resistance switching memory includes a stacked structure constituted with at least a bottom electrode 110, an insulating layer 120, and a line-shaped top electrode 130. The bottom electrode 110 is a multi-layered cup-shaped structure. An outer layer 116 is a barrier metal layer constituting the cup shape. An inner layer 112 is a metal layer made of oxygen gettering metal. An interlayer 114 is disposed between the outer layer 116 and the inner layer 112 and is formed on inner side surface of the cup-shaped outer layer 116. The bottom electrode 110 can be formed as a self-aligned contact (SAC) through a lithography-friendly layout. The SAC structure substantially likes a square shape, or other shapes which depends on designs. Examples of materials for the inner layer 112 and/or the outer layer 116 may include Al, Hf, Zr, Zn, W, Co, Au, Pt, Ru, Ir, Ti, and/or a conductive metal oxide. Examples of materials for the interlayer 114 may include tungsten, aluminum, titanium nitride, etc. The aforesaid metals may be used alone or in combination thereof.

In an embodiment introduced hereinafter, oxygen gettering metal materials may be used for the inner layer 112, such as Ti. The outer layer 116 may also include Ti, and the interlayer 114 may include titanium nitride (TiN).

In the resistance switching memory, the insulating layer 120 is disposed between the bottom electrode 110 and the top electrode 130. Examples of materials for the insulating layer 120 may include oxide or nitride, or a combination thereof. Examples of materials for the top electrode 130 may include Al, Hf, Zr, Zn, W, Co, Au, Pt, Ru, Ir, Ti, and/or a conductive metal oxide.

Referring to FIG. 1B, a resistive layer 140 made of resistance switching material is formed over the top electrode 130 to cover the sidewall of the patterned top electrode 130, and extended to further contact a portion 116a of the top surface of the lower electrode 110. The other portion 116b of the top surface of the lower electrode 110 is covered by the insulating layer 120. The resistive layer 140 may be formed of $HfO_2$, NiO, $TiO_2$, ZrO, ZnO, $WO_3$, CoO, CuO, $Nb_2O_5$, or a combination thereof. In a preferred embodiment, the resistive layer 140 is formed of $HfO_2$ and will be introduced hereinafter.

Because of the characteristics of oxygen gettering capability, an oxygen-deficient area 142 is formed on the portion 116a of the top surface of the lower electrode 110 covered by the resistive layer 140. Some filaments 144 may be formed to operate as a current path if the resistance switching memory is applied with a proper voltage. A switching area 146 is naturally very well confined to the central portion of the top surface of the lower electrode 110, proximal to the insulating layer 120.

Referring to FIG. 1C, the switching area 146 is confined to an area beneath a part of the resistive layer 140 extended alongside the sidewall of the top electrode 130 and the insulating layer 120, and over the contact surface between the lower electrode 110 and the resistive layer 140, as indicated by the reference number 146. The reference number 132 indicates the area of the stacked structure of the insulating layer 120 and the top electrode 130. The oxygen-deficient area 142 is formed on the portion 116a of the top surface of the lower electrode 110.

Figure 2:
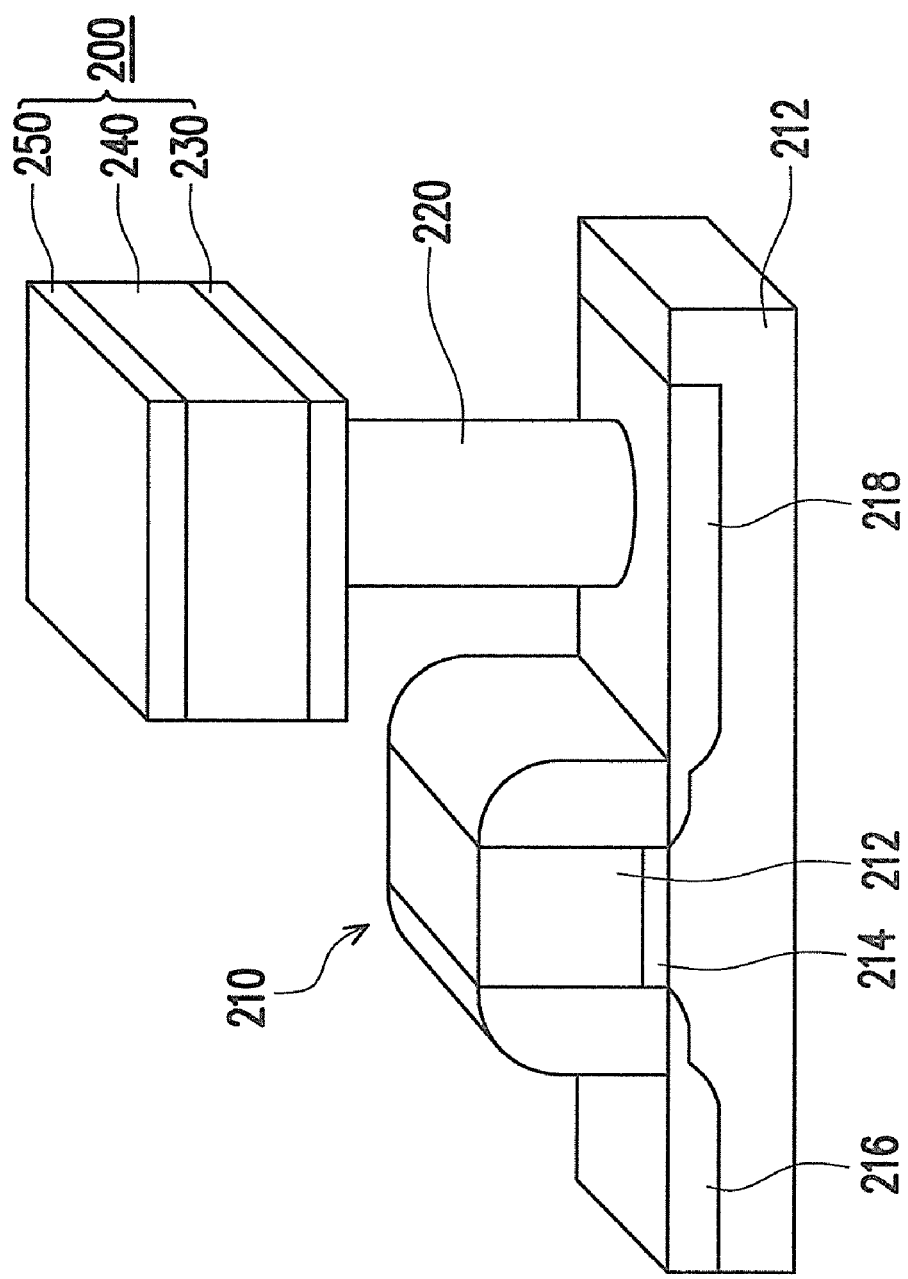
FIG. 2 is a lateral view of a RRAM and its peripheral driving structure according to one exemplary embodiment.

One of the exemplary embodiments for illustrating the proposed resistance switching memory is introduced hereinafter. A resistive random access memory (RRAM) is one exemplary embodiment of the resistance switching memory, but not limited thereto. Please refer to FIG. 2. FIG. 2 is a lateral view of an exemplary state of the art RRAM cell. The RRAM cell comprises one switch and one switchable resistance. Such a switch is, for example, a transistor or a diode. As shown in FIG. 2, a transistor 210 formed on a substrate 202 works as the switch for the RRAM. The transistor 210 includes a gate stacked structure with two sidewall nitride spacers and two doped regions. The gate structure may include a gate electrode layer 212 and a gate insulating layer 214. A contact plug 220 may be formed on one of the doped regions, for example, the second dopant region 218.

The RRAM 200 may be formed on the contact plug 220. The RRAM 200 in FIG. 2 is a schematic drawing for illustrating the one-switch-one-resistance (1S-1R) architecture. In the RRAM 200, a resistive layer 240 is formed between a lower electrode 230 and an upper electrode 250 for working as resistance switching material. In the embodiment, the RRAM 200 is replaced with the RRAM structure as shown in FIGS. 1A~1C, which is illustrated in FIG. 3A~3C.

Figure 3A:
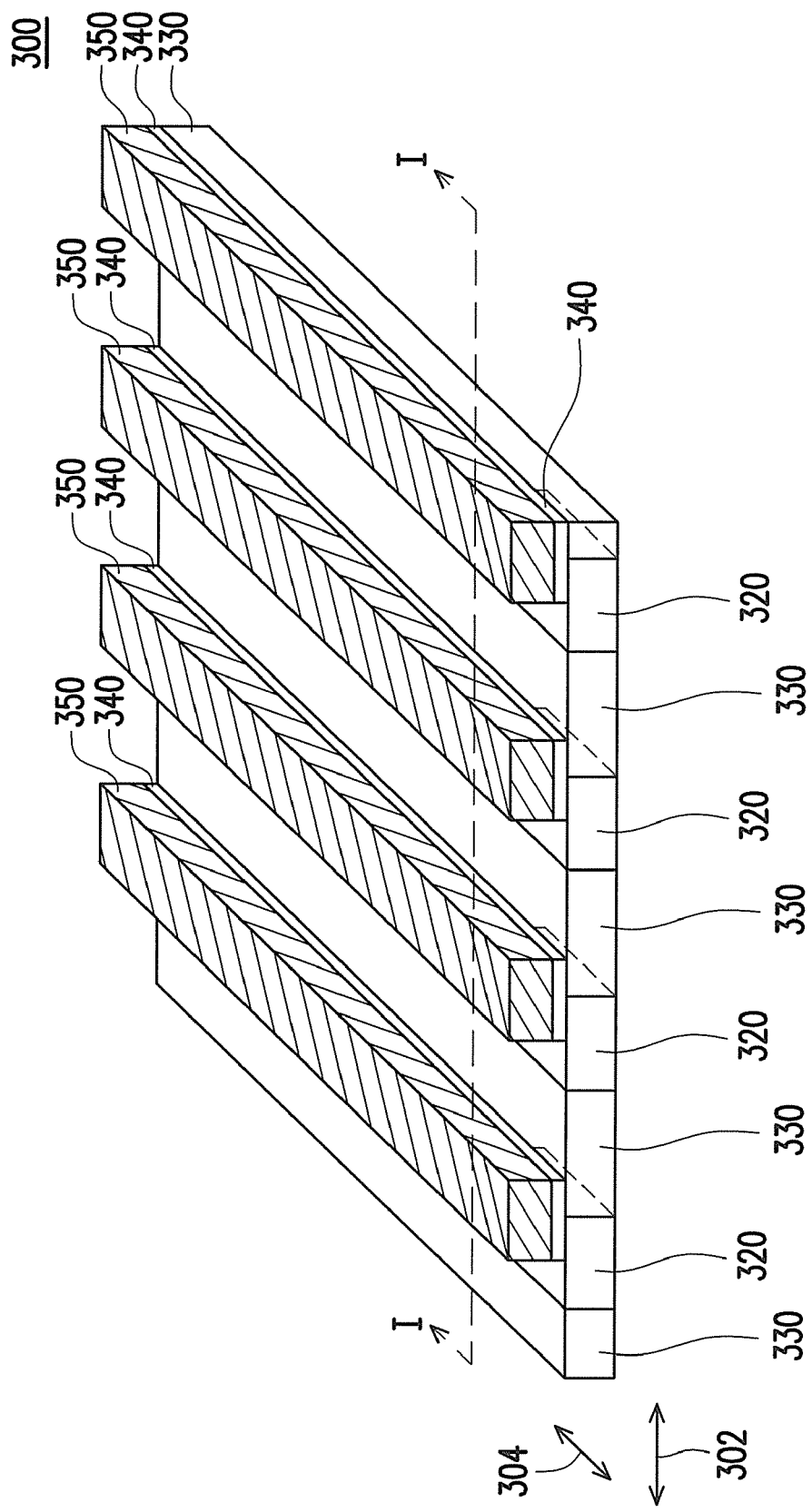
FIGS. 3A~3C illustrate a RRAM device with a memory array constituted with a plurality of RRAM structures in one exemplary embodiment.
Figure 3B:
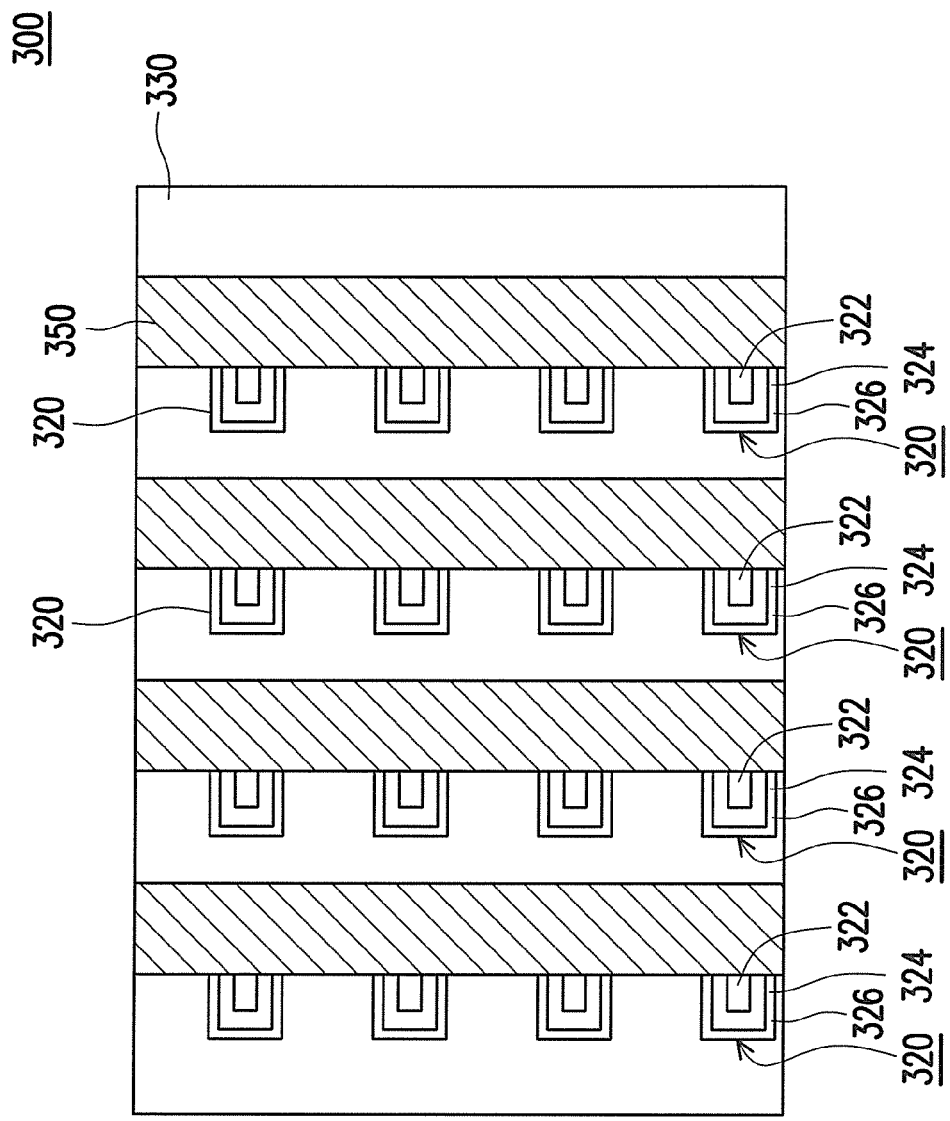
Figure 3C:
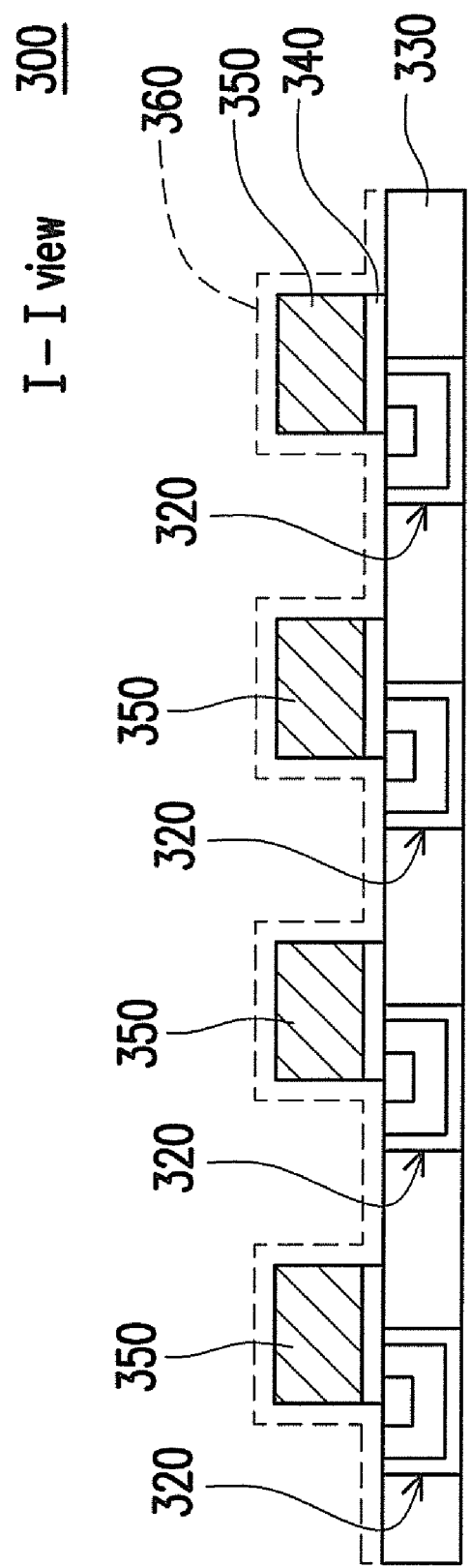

Referring to FIG. 3A~3C, a RRAM device with a memory array constituted with a plurality of RRAM structures of one of the exemplary embodiments. In the RRAM device 300, a plurality of lower electrodes 320 is formed in a substrate under the RRAM structures. Each lower electrode may be directly contacting one terminal of a switching device.

The lower electrodes 320 of the RRAM structures are formed in an interlayer dielectric layer 330. The RRAM structure further includes an insulating layer 340 and a line-shaped top electrode 350. The insulating layer 340 is partially formed between the top electrode 350 and a part of a top surface of the lower electrodes 320, and also partially formed on the interlayer dielectric layer 330. The line-shaped top electrodes 350 are arranged in a second direction 304, which may be perpendicular to the first direction 302, and are also substantially parallel to each other.

Referring to FIG. 3B, the lower electrode 320 of the RRAM structure may be a multi-layered cup-shaped structure, which is illustrated in FIGS. 1A and 1B. An outer layer 326 is a metal layer constituting the cup shape. An inner layer 322 is a metal layer made of oxygen gettering metal. An interlayer 324 acting as a barrier is disposed between the outer layer 326 and the inner layer 322 and is formed on inner side surface of the cup-shaped outer layer 326.

FIG. 3C is a schematically cross-sectional view of the RRAM device 300 according to the exemplary embodiment. A resistive layer 360 made of resistance switching material is formed over the top electrode 350 to cover the sidewall of the patterned top electrode 350 and the insulating layer 340, and extended to further contact a portion of the top surface of the lower electrode 320. The other portion of the top surface of the lower electrode 320 is covered by the insulating layer 340. The resistive layer 360 may be formed of $HfO_2$, NiO, $TiO_2$, ZrO, ZnO, $WO_3$, CoO, CuO, $Nb_2O_5$, or a combination thereof. In a preferred embodiment, the resistive layer 360 is formed of $HfO_2$ and will be introduced hereinafter. Because of the oxygen gettering capability, an oxygen-deficient area is formed on the portion of the top surface of the lower electrode 320 covered by the resistive layer 360. Some conductive paths ("filaments") may be formed in the oxide if a proper voltage is applied to the RRAM. A switching area is naturally very well confined to the central portion of the top surface of the lower electrode 320, proximal to the insulating layer 340.

In the aforesaid a RRAM illustrated in FIGS. 1A~1C, or RRAM device illustrated in FIGS. 3A~3C, the oxygen gettering metal material for the RRAM is preferably Ti, and the resistance switching material is preferably HfO$_2$. The option can be referred to the related paper titled "*Low Power and High Speed Bipolar Switching with A Thin Reactive Ti Buffer Layer in Robust HfO$_2$ Based RRAM*" in IEDM 2008. All disclosures of the paper are incorporated herein by reference herewith. In the paper, a novel HfO$_2$-based resistive memory with the TiN electrodes is proposed and fully integrated with 0.18 μm CMOS technology. By using a thin Ti layer as the reactive buffer layer into the anodic side of capacitor-like memory cell, excellent memory performances, such as low operation current (down to 25 μA), high on/off resistance ratio (above 1,000), fast switching speed (5 ns), satisfactory switching endurance (>10$^6$ cycles), and reliable data retention (10 years extrapolation at 200° C.) have been demonstrated in our memory device. Moreover, the benefits of high yield, robust memory performance at high temperature (200° C.), excellent scalability, and multi-level operation promise its application in the next generation nonvolatile memory.

Being a potential candidate to replace the flash memory, the binary oxide-based resistive memory is very attractive owing to its simple cell structure. However, several significant issues, including poor yield, instability of operation parameters, unsatisfactory switching endurance and the necessity of process integration with noble metal electrode, limit the resistive memory in this category from the realization. Ti metal is well known for its ability to absorb oxygen atoms from buried HfO$_2$ (H. Kim, P. McIntyre, C. O. Chui, K. Saraswat and S. Stemmer, "Engineering chemically abrupt high-k metal oxide/silicon interfaces using an oxygen-gettering metal overlayer," J. Appl. Phys. Vol. 96, p. 34-67, 2004) and modify the resistive switching property of the ZrO2 (C.-Y. Lin, C.-Y. Wu, C.-Y. Wu, T.-C. Lee, F.-L. Yang, C. Hu and T.-Y. Tseng, "Effect of top electrode material on resistive switching properties of ZrO$_2$ film memory devices," IEEE Electron Dev. Lett. Vol. 28, p. 366, 2007.) In this work, a novel HfO$_2$-based resistive memory with a thin Ti cap layer was fabricated. The TiN/Ti bi-layer can greatly improve the performance of the resistive memory device, which seems to solve all the issues seen in previous studies of the oxide-based resistive memory.

The memory device consisting of TiN/TiOX/HfO$_x$/TiN structure was fabricated on Ti/SiO$_2$/Si substrate by alloying the TiN/Ti/HfO$_2$/TiN stack layers. Except for the HfO$_2$ film, which was deposited by atomic layer deposition (ASM Polygon 8200), all the other films, including the thin Ti layer, were deposited by sputtering methods. One transistor and one resistor (1T-1R) memory circuit was realized by 0.18 μm CMOS technology on 8" wafer with post metal alloying (PMA) at 400° C., which is the highest process temperature to fabricate the memory device. Due to the ability of Ti to getter oxygen atoms, a large amount of oxygen atoms diffuse from the HfO$_2$ layer to the Ti overlayer, resulting in the formation of HfO$_x$ (x~1.4) with great oxygen deficiency and oxidation of Ti.

In the embodiment of a manufacturing method for a RRAM structure, in order to avoid the damages in fabrication, a resistance switching material, for example, an oxide such as HfO$_2$, is deposited after the top electrode is patterned. In a lithographic-friendly layout, the top electrode will be a line. Furthermore, the oxide directly contacts a lower bottom electrode, which is preferably formed as a self-aligned contact, also to serve the lithography-friendly layout. The bit line is separated vertically from the lower electrode by a metal pedestal.

In the embodiment, the oxygen gettering metal material for the RRAM is Ti, and the resistance switching material is HfO$_2$ for illustration, but not limited thereto. In the embodiment, it is preferred to form a self-aligned contact (SAC) as a lower electrode. A contact hole is filled with a Ti adhesion layer, followed with a TiN barrier layer, and finally with a final Ti layer. Alternatively, the adhesion layer may be TiN as well. In the SAC, the outer Ti or TiN layer is partially oxidized by the surrounding silicon dioxide. The central Ti layer is not oxidized by the surrounding silicon dioxide. After the contact is formed, it may be planarized by, for example, a chemical mechanical process (CMP). Nitride, acting as an etch-stop layer, is deposited over the SAC. Metal constituting the bit line is then deposited on the nitride. Bit lines are formed by line-pattern lithography and etching, through both the metal and nitride. The lines are positioned so that the edge overlaps the top surface of the central Ti portion of the contact. This requires alignment which is about one-tenth (1/10) of the bit line pitch, e.g., 8 nanometer (nm) @ 40 nm design rule achievable today. Finally, the memory material, e.g., HfO$_2$ is deposited over the formed bit line, covering the sidewall of the metal and underlying nitride, as well as the top surface of the exposed Ti/TiN/Ti or TiN/Ti contact.

Figure 4A:
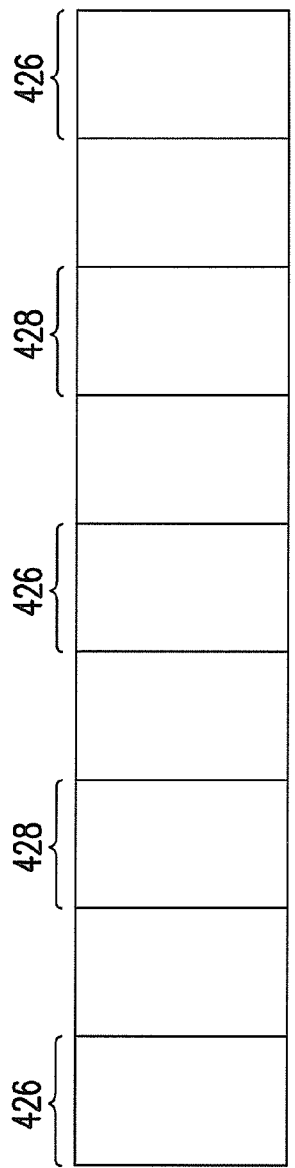
Figure 4B:
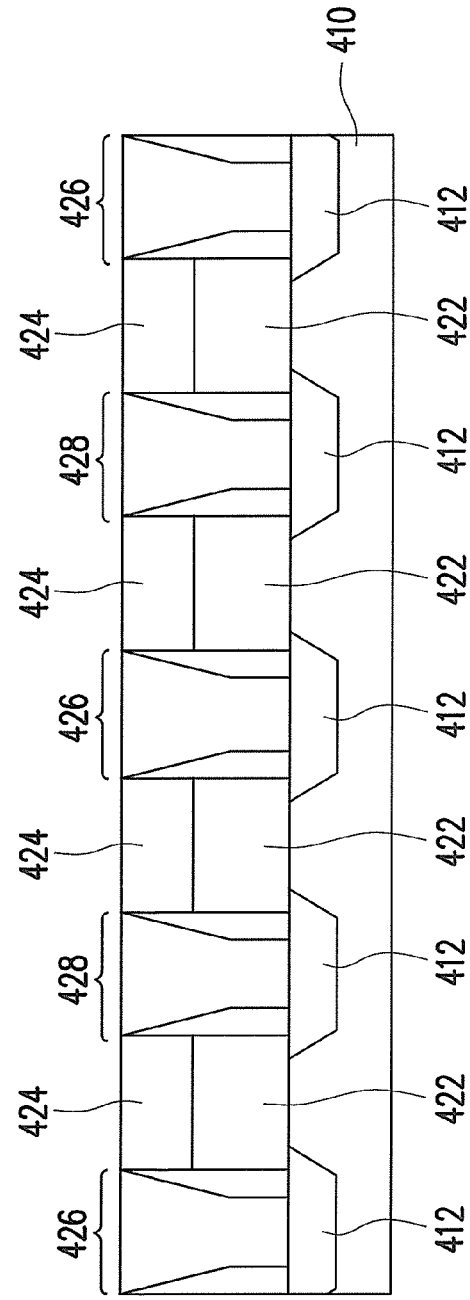

One of examples of fabricating the RRAM structure is illustrated in FIGS. 4A~9A in a top view and accompanying FIGS. 4B~9B in a cross-section view. Referring to FIG. 4A and FIG. 4B, contact regions 412 for a switch, for example, the doped regions of a transistor (as shown), or one terminal of a diode are formed in a substrate 410. Contact lines 422 each of which is stacked with an insulating layer 424 above are formed on a substrate 410 parallel to each other. Spacers are formed aside sidewalls of the stacked structures including the contact line 422 and the insulating layer 424. A plurality of reference voltage layers 426 are optionally formed in one of every two regions between the stacked structures. The reference voltage layer 426 is, for example, connected to ground. The regions without connecting to the ground are ready for forming SAC contacts as one example, which are indicated by the reference numbers 428.

Referring to FIG. 5A and FIG. 5B, an etching stop layer 432 is formed over the substrate 410 and then patterned to expose the regions 428. A self-aligned contact (SAC) oxide etching process is performed to removing the materials in the regions 428. The etching process is selective with respect to the materials of the contact line 422, the insulating layer 424 and spacers beside the stacked structure.

Figure 6A:
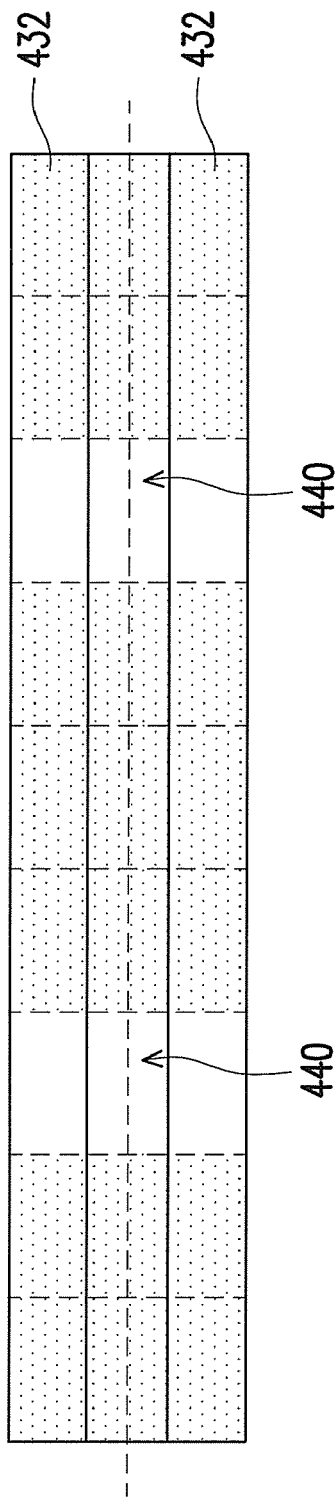
Figure 6B:
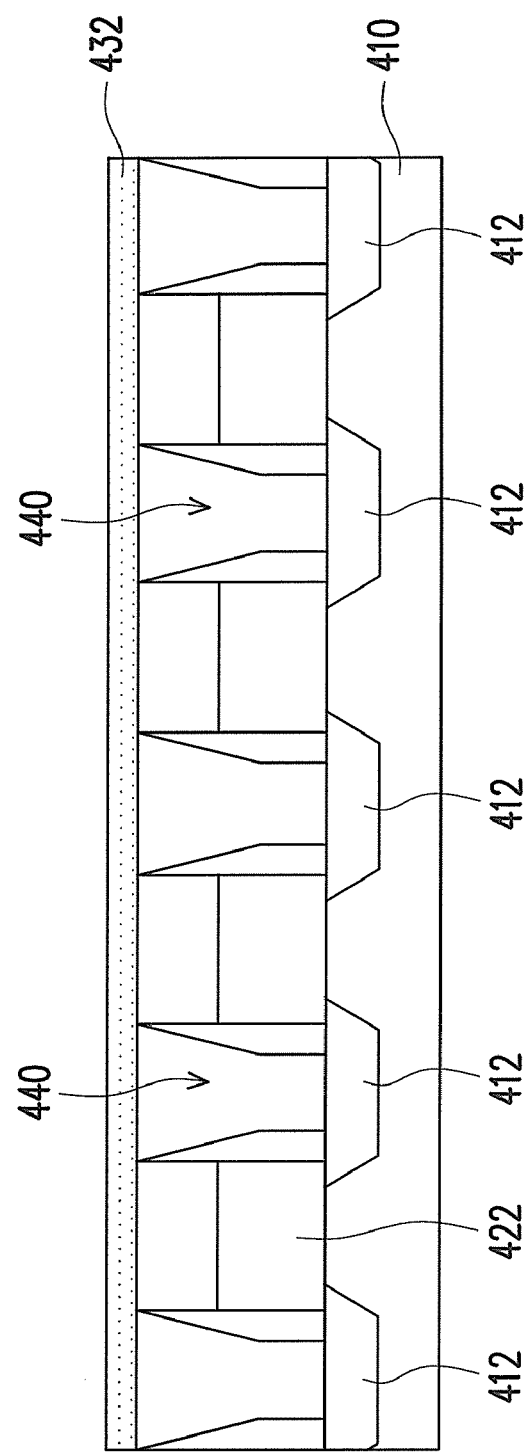

Referring to FIG. 6A and FIG. 6B, SAC holes 440 are formed to expose portions of a top surface of the substrate 410. Referring to FIG. 7A and FIG. 7B, the contact holes 440 is then filled with a Ti or TiN adhesion layer 456, followed with a TiN barrier layer 454, and finally with a final Ti layer 452. In the SAC, the outer Ti or TiN adhesion layer 456 is partially oxidized by the surrounding silicon dioxide. The central Ti layer 452 is not oxidized by the surrounding silicon dioxide. After the contact is formed, it may be planarized by, for example, a chemical mechanical process (CMP). The lower electrode 450 for RRAM is formed accordingly.

Figure 8A:
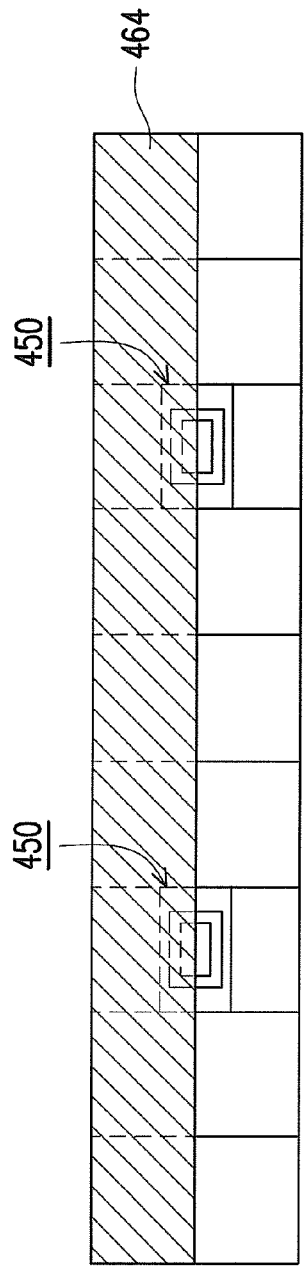
Figure 8B:
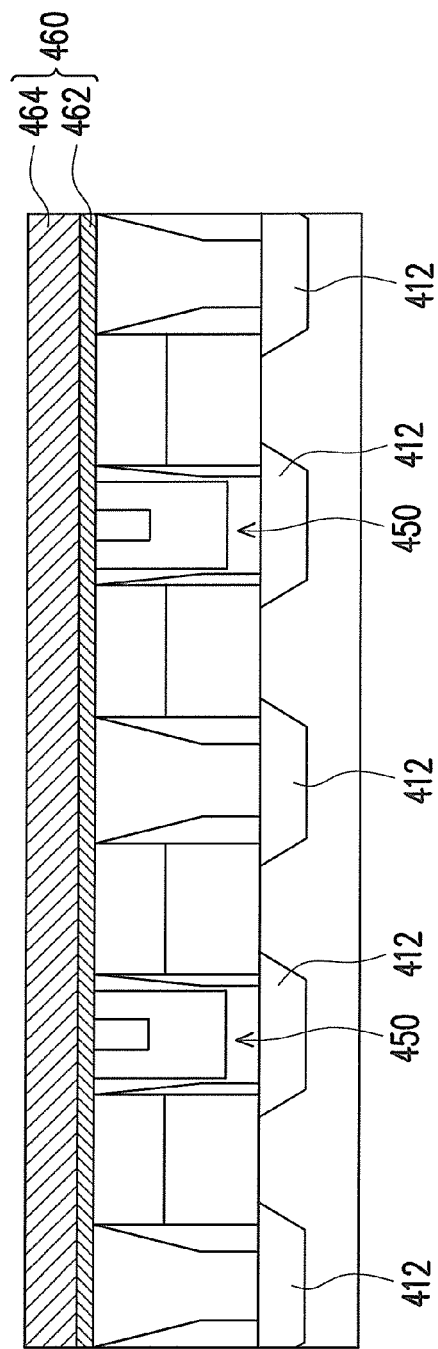

Referring to FIG. 8A and FIG. 8B, a nitride layer, which is materials for an insulating layer, is deposited over the contact and nitride cover layers. A metal layer constituting the bit line is then deposited on the nitride layer. Bit lines 460 are formed by line-pattern lithography and etching, through both the metal layer and the nitride layer. Top electrodes 464 and the insulating layer 462 under the top electrode are formed. The top electrodes 464 and the insulating layer 462 are positioned so that the edge overlaps the top surface of the central Ti portion of the lower electrode 450. This requires, for example, alignment which is about one-tenth (1/10) of the bit line pitch, e.g., 8 nanometer (nm) @ 40 nm design rule achievable today.

Figure 9A:
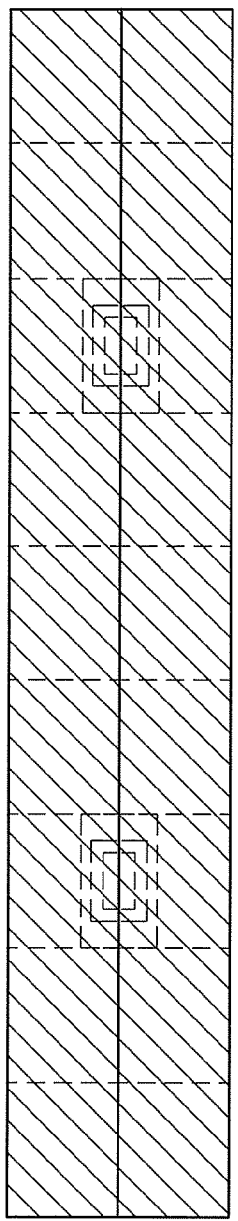
Figure 9B:
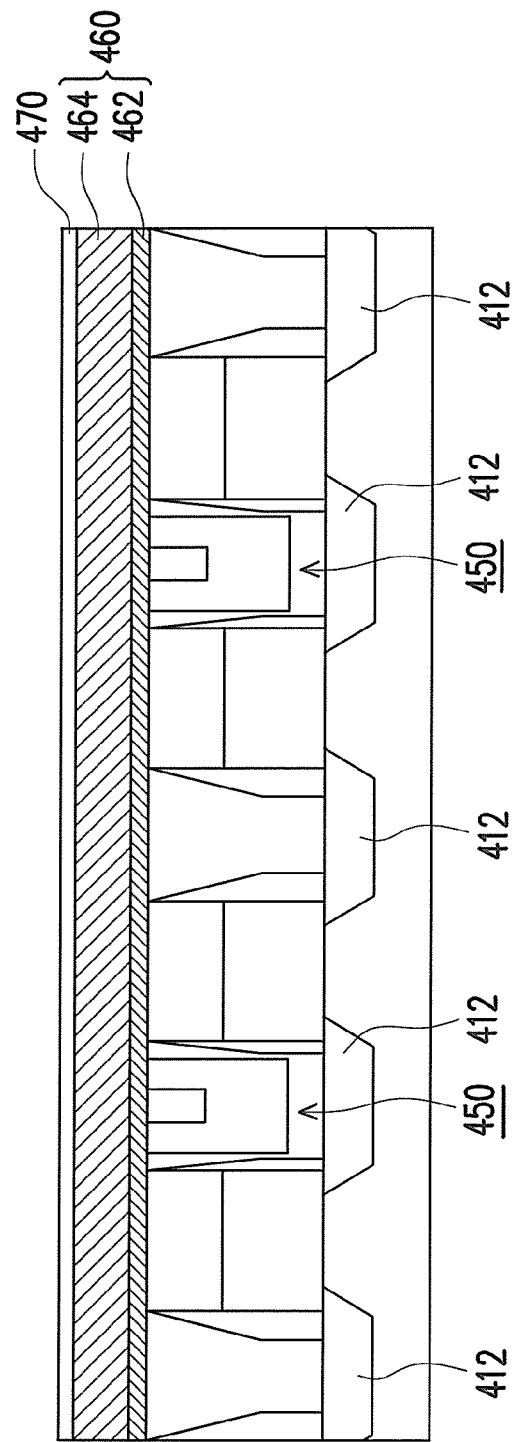

Referring to FIG. 9A and FIG. 9B, finally, the memory material 470, e.g., $HfO_2$ is deposited over the formed bit line, covering of the top electrodes 464 and the underlying insulating layer 462, as well as the top surface of the exposed lower electrode 450, the Ti/TiN/Ti or TiN/Ti contact.

Although the present exemplary embodiment has been described with reference to the above exemplary embodiments, it will be apparent to one of the ordinary skill in the art that modifications to the described exemplary embodiment may be made without departing from the spirit of the invention. Accordingly, the scope of the invention will be defined by the attached claims not by the above detailed descriptions.

What is claimed is:

1. A resistance switching memory, comprising:
   a lower electrode with an oxygen gettering metal layer disposed therein;
   an insulating layer, partially covering a first portion of a surface of the lower electrode;
   a top electrode, the insulating layer being disposed between the lower electrode and the top electrode; and
   a resistance-switching material layer, covering a sidewall of the top electrode and the underlying insulating layer and also covering a second portion of the surface of the lower electrode to contact a surface of the oxygen gettering metal layer.

2. The resistance switching memory of claim 1, wherein the resistance switching memory is a resistive random access memory (RRAM).

3. The resistance switching memory of claim 1, wherein the lower electrode is a multi-layered cup-shaped structure with a cup-shaped outer layer, an interlayer formed on inner sidewall of the cup-shaped outer layer, and the gettering metal layer, wherein the interlayer is disposed between the cup-shaped outer barrier layer and the gettering metal layer, and the gettering metal layer is disposed closer to the central portion of the surface of the lower electrode.

4. The resistance switching memory of claim 3, wherein the cup-shaped outer layer includes TiN, Al, Hf, Zr, Zn, W, Co, Au, Pt, Ru, Ir, Ti, a conductive metal oxide, alone or in combination thereof.

5. The resistance switching memory of claim 3, wherein the interlayer includes tungsten, aluminum or titanium nitride, alone or in combination thereof.

6. The resistance switching memory of claim 3, wherein the gettering metal layer is made of Al, Hf, Zr, Zn, W, Co, Au, Pt, Ru, Ir or Ti, alone or in combination thereof.

7. The resistance switching memory of claim 1, wherein the insulating layer includes oxide or nitride, or a combination thereof.

8. The resistance switching memory of claim 1, wherein the top electrode includes Al, Hf, Zr, Zn, W, Co, Au, Pt, Ru, Ir, Ti, and/or a conductive metal oxide, alone or in combination thereof.

9. The resistance switching memory of claim 1, wherein resistance-switching material layer is made of $HfO_2$, NiO, $TiO_2$, ZrO, ZnO, $WO_3$, CoO, CuO, $Nb_2O_5$, or a combination thereof.

10. The resistance switching memory of claim 1, wherein a switching area is confined to an area beneath a part of the resistance-switching material layer extended alongside the sidewall of the top electrode and the insulating layer, and over the contact surface between the lower electrode and the resistance-switching material layer.

11. The resistance switching memory of claim 1, wherein the oxygen gettering metal layer is made of Ti and the resistance-switching material layer is made of $HfO_2$, and a switching area is confined to an area between the lower electrode and the resistance-switching material layer.

12. The resistance switching memory of claim 11, wherein the resistance switching memory is a resistive random access memory (RRAM).

13. A resistance switching memory device comprising a plurality of resistance switching memories as claimed in claim 1, the resistance switching memory device further comprising a plurality of contact regions, arranged in a first direction and in parallel to each other, where each of the contact regions is a contact terminal for a switch, wherein the plurality of resistance switching memories are arranged in a memory array and each of the resistance switching memories is at least connected to its corresponding one of the contact regions.

14. The resistance switching memory device as claim in claim 13, further comprising a plurality of contact plugs, each of which is disposed between the resistance switching memory and the corresponding contact region for connecting to each other.

15. The resistance switching memory device as claim in claim 13, wherein the contact region is a doped region of a transistor, wherein the transistor works as the switch.

16. The resistance switching memory device as claim in claim 13, wherein the contact region is a doped region of a diode, wherein the diode works as the switch.

17. A resistance switching memory,
   comprising: a stacked structure comprising a lower electrode, and a top electrode stacked on top of an insulating layer, wherein the stacked structure is line-shaped;
   a resistance-switching material layer, covering the sidewall of the line-shaped top electrode, and extended alongside to further contact a portion of a surface of a lower electrode; and
   wherein the lower electrode comprise an oxygen gettering metal layer disposed therein, the resistance-switching material layer covering at least part of the surface of the lower electrode contact and at least part of the oxygen gettering metal layer.

18. The resistance switching memory of claim 17, wherein the oxygen gettering metal layer is made of Ti and the resistance-switching material layer is made of HfO2, and a switching area is confined to an area between the lower electrode and the resistance-switching material layer.

19. The resistance switching memory of claim 17, wherein a switching area is confined to an area beneath a part of the resistance-switching material layer extended alongside the sidewall of the top electrode and the insulating layer, and over the contact surface between the lower electrode and the resistance-switching material layer.

* * * * *